United States Patent [19]

Saegusa

[11] Patent Number: 5,323,106
[45] Date of Patent: Jun. 21, 1994

[54] DEVICE FOR TESTING SEMICONDUCTOR DEVICES

[75] Inventor: Takeshi Saegusa, Yamanashi, Japan

[73] Assignee: Tokyo Electron Yamanashi Limited, Nirasaki, Japan

[21] Appl. No.: 886,802

[22] Filed: May 22, 1992

[30] Foreign Application Priority Data

May 22, 1991 [JP] Japan .................................. 3-116494

[51] Int. Cl.$^5$ .............................................. G01R 1/073
[52] U.S. Cl. ................................ 324/158 P; 324/158 F
[58] Field of Search ................ 324/158 P, 158 F, 72.5

[56] References Cited

U.S. PATENT DOCUMENTS 5,066,907 11/1991 Tarzwell et al. ................ 324/158 P

FOREIGN PATENT DOCUMENTS 0309261 12/1990 Japan ................ 324/158 P

Primary Examiner—Ernest F. Karlsen
Attorney, Agent, or Firm—Oblon, Spivak, McClelland, Maier & Neustadt

[57] ABSTRACT

A device for testing semiconductor devices includes a group of probes arranged to correspond to at least a row of electrode terminals which are formed on each of the semiconductor devices, a printed plate having an opening in which the semiconductor device is positioned and a conductive pattern, four guide members made of insulating material and having a face on which a plurality of grooves are formed to hole and arrange the probes at the same pitch as that of the electrode terminals, and a positioning member and an upper guide which position the guide members relative to the semiconductor device and the printed plate to electrically and detachably contact the probes with the electrode terminals and the conductive lines along the rim of the opening of the printed plate.

14 Claims, 5 Drawing Sheets

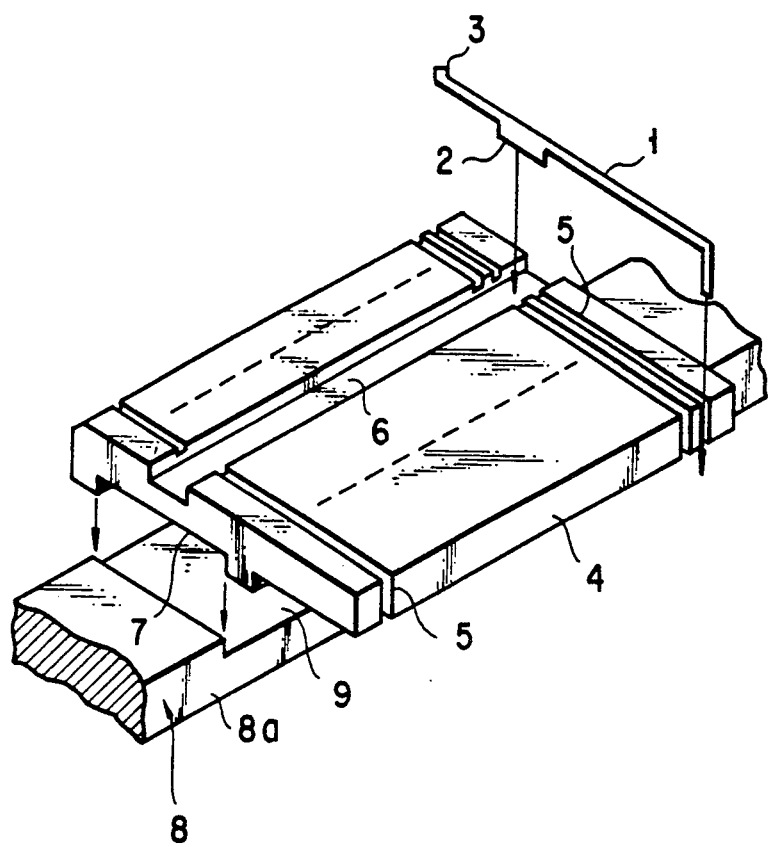
F I G. 1

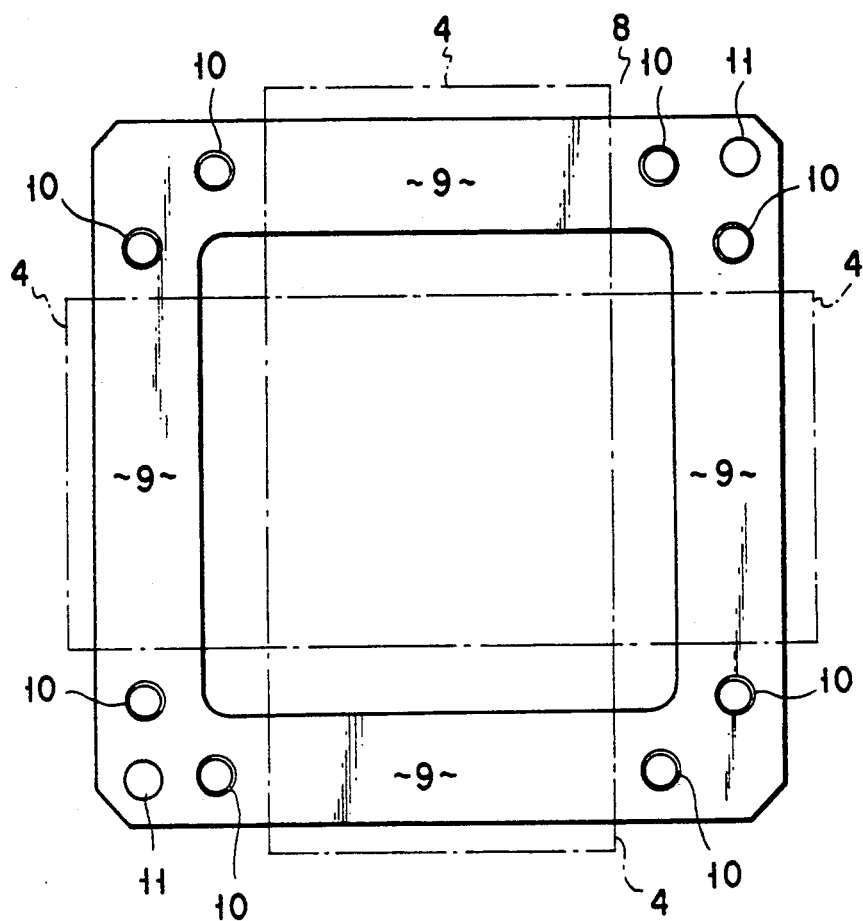
F I G. 2
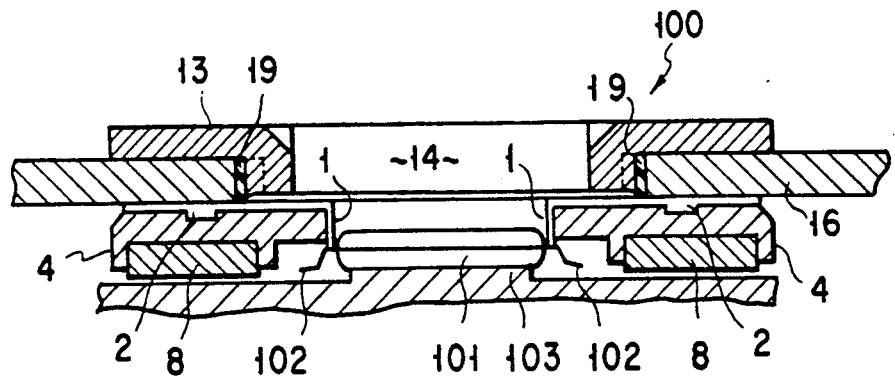
F I G. 3

DEVICE FOR TESTING SEMICONDUCTOR DEVICES

BACKGROUND OF THE INVENTION

1. Field of the Invention

The present invention relates to a device for testing semiconductor devices through probes.

2. Description of the Related Art

Electric characteristics of those semiconductor devices which are packaged as finished products have been conducted in the course of manufacturing them. Their packages are quite numerous in kind. In order to test these quite variously packaged semiconductor devices, therefore, the testing device (or IC handler) must be exchanged every group of packages. In addition, a trend has been created these days that semiconductor devices are made more in kind but less in number. The universal handler has been developed to meet these needs. When the unit of electric connector (or contactor) which is electrically contacted with the semiconductor device is exchanged with others, variously-shaped semiconductor devices can be tested by the universal handler alone.

Contactors used for this universal handler can be divided into some types: One of them is to contact spring probes with electrode terminals (or leads) of the semiconductor device, the other is of the socket type in which the plugging of leads of the semiconductor device is made, and a further is to contact conductive rubber with leads of the semiconductor device.

However, the recent trend of making semiconductor devices more and more highly integrated is remarkable. In addition, the pitch at which electrode terminals are formed on semiconductor devices is required to become smaller and smaller, say, smaller than 0.5 mm. This requires a plurality of probes to be arranged on the contactors at a certain position thereof and with a higher accuracy. This is the reason why a semiconductor devices testing device capable of being used for more numerous kinds of semiconductor devices and more easily maintained is needed.

SUMMARY OF THE INVENTION

The object of the present invention is therefore to provide a device for testing semiconductor devices, said testing device being capable of more easily arranging probes so as to more accurately correspond to electrode terminals on semiconductor devices to be tested and also capable of more easily exchanging its probes holding component with others.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view showing a part of the semiconductor devices testing device according to an embodiment of the present invention;

FIG. 2 is a plan view showing positioning members in FIG. 1;

FIG. 3 is a sectional view showing a contactor in FIG. 1;

FIGS. 6A and 6B show the semiconductor devices testing device according to another embodiment of the present invention, in which FIG. 6A is a plan view showing how plural probes, a conductive pattern of the printed plate and leads are related to one another and FIG. 6B is a sectional view showing a part of the assembly from which the upper guide is removed.

DETAILED DESCRIPTION OF THE PREFERRED EMBODIMENTS

Figure 4:
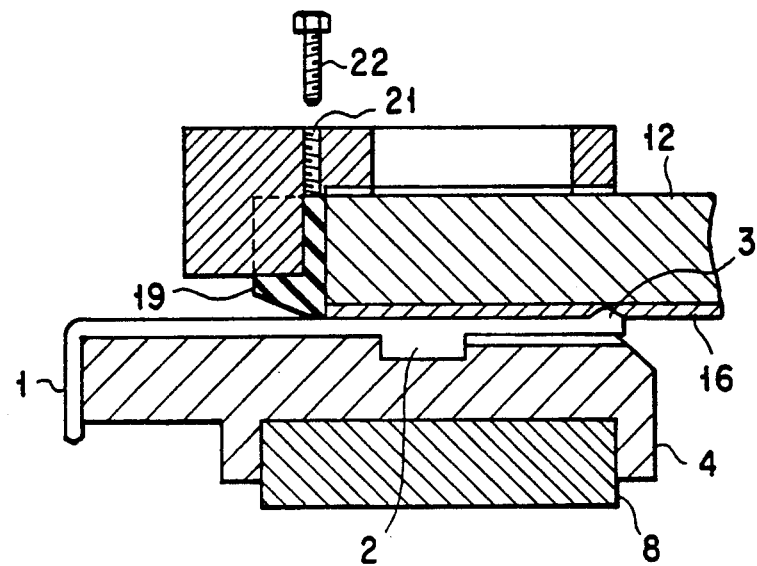
FIG. 4 is a sectional view showing a part of the contactor in FIG. 3 enlarged.

The testing device according to an embodiment of the present invention will be described referring to FIGS. 1 through 5.

As shown in FIG. 1, a probe 1 is an L-shaped and elongated thin metal piece having high conductivity. The probe 1 has a rectangular positioning projection 2 projected downward from the center portion thereof, another electrically contacted projection 3 projected, about 0.1 mm–0.3 mm high, upward from the rear end thereof, and a further contact projection projected downward from the front end at a right angle, when viewed in the longitudinal direction.

A guide member 4 is a rectangular plate made of insulating material such as PEEK. Guide grooves 5, same in number and pitch as leads or lead terminals of the semiconductor device to be measured, are formed side by side in the guide member 4 in the longitudinal direction thereof. Each of these guide grooves 5 formed extends onto the front side of the guide member 4. A recess 6 shaped and positioned to receive the positioning projection 2 of the probe 1 so as to position the probe 1 in the longitudinal direction is also formed, perpendicular to the guide grooves 5, on the guide member 4. When the probes 1 are fitted in the guide grooves 5 of the guide member 4 while closely seating their positioning projections 2 in the recess 6, they can be positioned at the same pitch as that of leads of the semiconductor device to be measured.

A rectangular groove 7 is formed on the underside of the guide member 4, extending from one end of the member 4 to the other end thereof in the longitudinal direction. The groove 7 is fitted onto a positioning recess 9 formed on each of four side arms 8a which are made of stainless steel and which are assembled like a frame to form a square positioning member 8. More specifically, the arm 8a is same in width as the groove 7 and the recess 9 is same in width as the arm 8a and same in length as the guide member 4. When its groove 7 is fitted onto the recess 9 of the arm 8a therefore, the guide member 4 is limited in its movement in plane directions (or length and width directions). When the guide member 4 is attached to the positioning member 8 in this manner, therefore, the probes 1 seated in the guide grooves 5 on the guide member 4 as described above can be positioned to correspond to leads of the semiconductor device such as QFP.

As shown in FIG. 2, two fixing screw holes 10 separated from the diagonal line by certain distance are formed at each of four corners of the positioning member 8, passing through the member 8 from top to bottom thereof. Two pin holes 11 are further formed at two corners of the positioning member 8 on the diagonal line, passing through the member 8 from top to bottom thereof.

Figure 5:
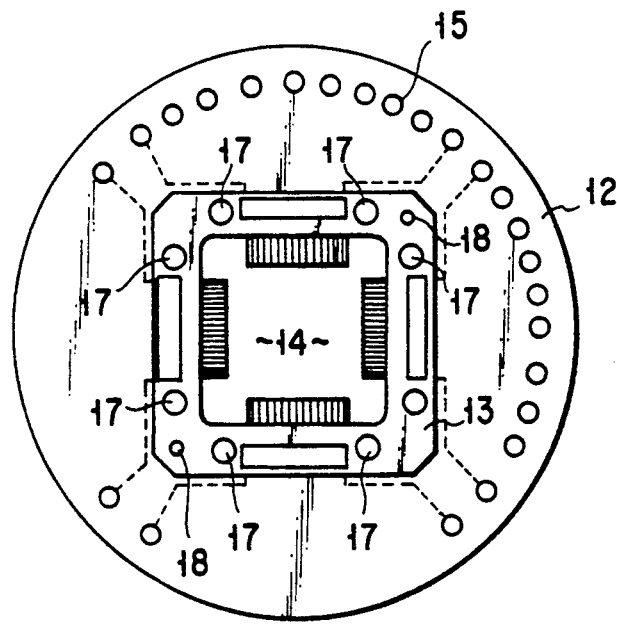
FIG. 5 is a top view showing the whole of the contactor in FIG. 1.

As shown in FIGS. 3 through 5, the positioning member 8 to which the guide members 4 have been attached as described above is positioned on the under side of a circular printed plate 12, extending its four side arms 8a along a rectangular center opening 14 of the printed plate 12. As apparent from the Figures, the opening 14 of the printed plate 12 is so sized as to allow all of the guide members 4, which have been attached to the positioning member 8, to project into the opening 14 of the printed plate 12.

An upper guide 13 is arranged on the printed plate 12. The upper guide 13 is made of the same material such as stainless steel as that of the positioning member 8 and it is a rectangular frame having an opening at the center thereof. The inner rim of the upper guide 13 is bent downward, entering into the opening 14 of the printed plate 12. As seen in the case of the positioning member 8, the upper guide 13 has fixing screw and pin holes 17 and 18 which are aligned with those of the positioning member 8. The printed plate 12 also has fixing screw and pin holes which are aligned with those of the members 8 and 13.

A plurality of through-holes 15 are formed along the outer rim of the printed plate 12. FIG. 5 shows these through-holes 15 arranged on a single circle for the sake of simplicity, but it is preferable from the practical viewpoint that they are arranged on plural circles. A conductive pattern 16 is formed on the underside of the printed plate 12 to electrically connect these through-holes 15 to the rim of the opening 14. This conductive pattern 16 comprises a plurality of signal wirings insulated from one another. Each of these wirings is positioned relative to its corresponding probe 1 located near the rim of the opening 14 and it comprises a contact section extending perpendicular to the rim of the opening 14 and a connecting section extending from the contact section to the through-hole 15.

When the positioning member 8, the printed plate 12 and the upper guide 13 are combined as a unit by the fixing screws and the positioning pins, therefore, a contactor 100 is formed as shown in FIG. 3. More specifically, the positioning member 8 and the upper guide 13 are positioned relative to each other, sandwiching the printed plate 12 between them. Positioning pins are inserted into the pin holes 11 and 18 while screws are screwed into the screw holes 10 and 17. The positioning member 8, the printed plate 12 and the upper guide 13 are thus positioned and fixed to one another. In other words, the probes 1 are positioned to correspond to leads 102 of the semiconductor device 101 and the connecting projections 3 of the probes 1 are pressed against the conductive pattern 16 on the underside of a printed plate 12. As the result, electric contact can be established among the semiconductor device 101, probes 1 and the printed plate 12.

A pressing hard member 19 made of PEEK and extending along the row of probes 1 on each guide member 4 is interposed between a rear face of the bent front end of the upper guide 13 and a front face of the opening 14 of the printed plate 12. A screw hole 21 is formed in the upper guide 13 to open on the top of the pressing member 19, as shown in FIG. 4. A pressing screw 22 is screwed into the screw hole 21 at the final assembly step to downwardly press the top of the pressing member 19. The center portions of the probes 1 are thus pressed against the guide member 4 by the pressing member 19. As a result, tolerances of the printed plate 12, the probes 1 and others are absorbed, so that the probes 1 can be held firm without becoming deformed and unsteady. When the probes 1 of the above-arranged contactor 100 are contacted, as shown in FIG. 3, with leads 102 of the semiconductor device 101 mounted on a measuring stage 103, electric conductivity can be established relative to the semiconductor device 101. In other words, electric characteristics of the semiconductor device 101 can be examined by a measuring device (or tester) through the conductive pattern 16 of the contactor 100 and the through-holes 15. The measuring stage 103 and the contactor 100 can be moved up and down relative to each other by a drive means (not shown) and when they are kept separated from each other, the semiconductor device 101 can be loaded and unloaded on and from the measuring stage by a carrier means (not shown).

According to the above-described embodiment, the rear end portion of the guide member 4 is set a little lower than front end portion thereof. Therefore, the front end portion of each of the probes 1 is contacted with the top of the guide member 4 but the rear end portion thereof is separated from it. The projection 3 is projected upward from the rear end of this rear end portion of the probe 1. As a result, the projection 3 can be elastically contacted with the conductive pattern 16 of the printed plate 12 by the elasticity of its probe 1, so that reliable electric contact can be established between them. Dimensions and materials of the components are set or selected in such a way that contact pressure between the projections 3 of the probes 1 and the conductive patter 16 may become from 100g to 200g, most preferable about 120g, and that contact pressure between the leads 120 of the semiconductor device and the probes 1 may become from 10g to 1200g, most preferably about 30g. When selected in this manner, it can be understood that the contact pressure of the probes 1 is higher relative to the conductive pattern 16 than relative to the leads 102. This is intended to prevent the leads 102 from being damaged and deformed by the excessive contact pressure of the probes 1. The bent front end portion of each of the probes 1 is projected downward from the underside of the guide member 4 by 0.6 mm, maximum, but usually by 0.1 to 0.3 mm.

Figure 6A:
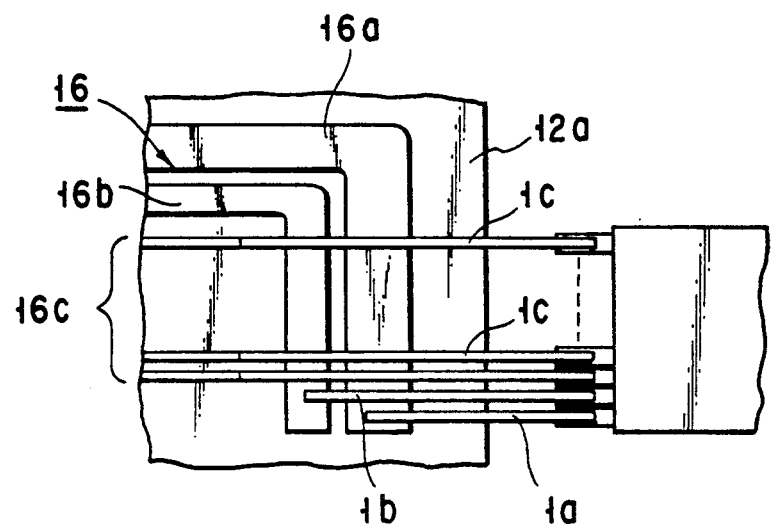
Figure 6B:
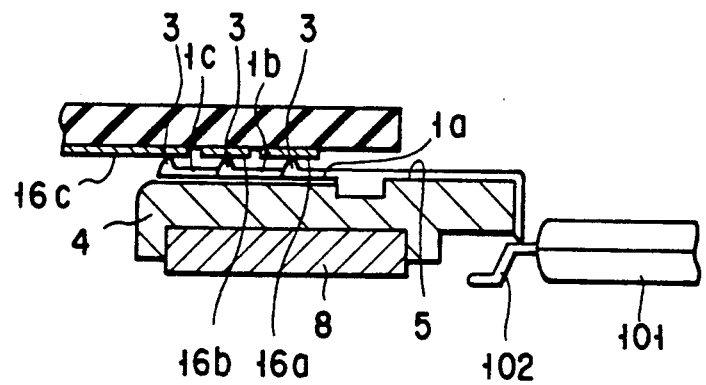

According to the above-described embodiment, all of the probes 1 are same in dimensions and their contact points relative to the leads 102 are aligned on a straight line. However, the present invention is not limited to the probes arranged in this manner, but they may be arranged as shown in FIGS. 6A and 6B. This another embodiment of the present invention will be now described referring to FIGS. 6A and 6B, but same components as those of the above-described embodiment will be represented same reference numerals and description on these components will be omitted.

Three kinds of probes 1a, 1b and 1c, different in length, are selectively seated in the guide grooves 5 on the top of the guide member 4. According to this second embodiment, the shortest probe 1a is positioned on one end of the guide member 4, the probe 1b of medium length is then positioned next to the probe 1a, and all of others positioned next to the probe 1b at a certain pitch are the longest probes 1c, but this positioning of these probes 1a, 1b and 1c can be changed as desired. The bent front ends of these probes 1a, 1b and 1c are aligned on a straight line, as seen in the first embodiment, pressing the leads 102 downward. Their rear ends or projections 3 are shifted from one another because they are different in length.

The conductive pattern 16 formed on the printed plate 12 comprises three kinds of patterns 16a, 16b and 16c. The first pattern 16a formed nearest the opening of the printed plate 12 is a power source line connected to a power source (not shown). The second pattern 16b formed parallel to the first one 16a is an earth line and plurality of third patterns 16c formed parallel to one another are signal pickup lines.

When the semiconductor module is to be probed or examined, simultaneous electric contacts of the shortest probe 1a relative to the power source line 16a, of the probe 1b of medium length relative to the earth line 16b, and of the longest probes 1c to the signal lines 16c can be achieved. This enables various probes or examinations of the semiconductor module to be achieved at the same time but without changing the contactor.

Figure 7:
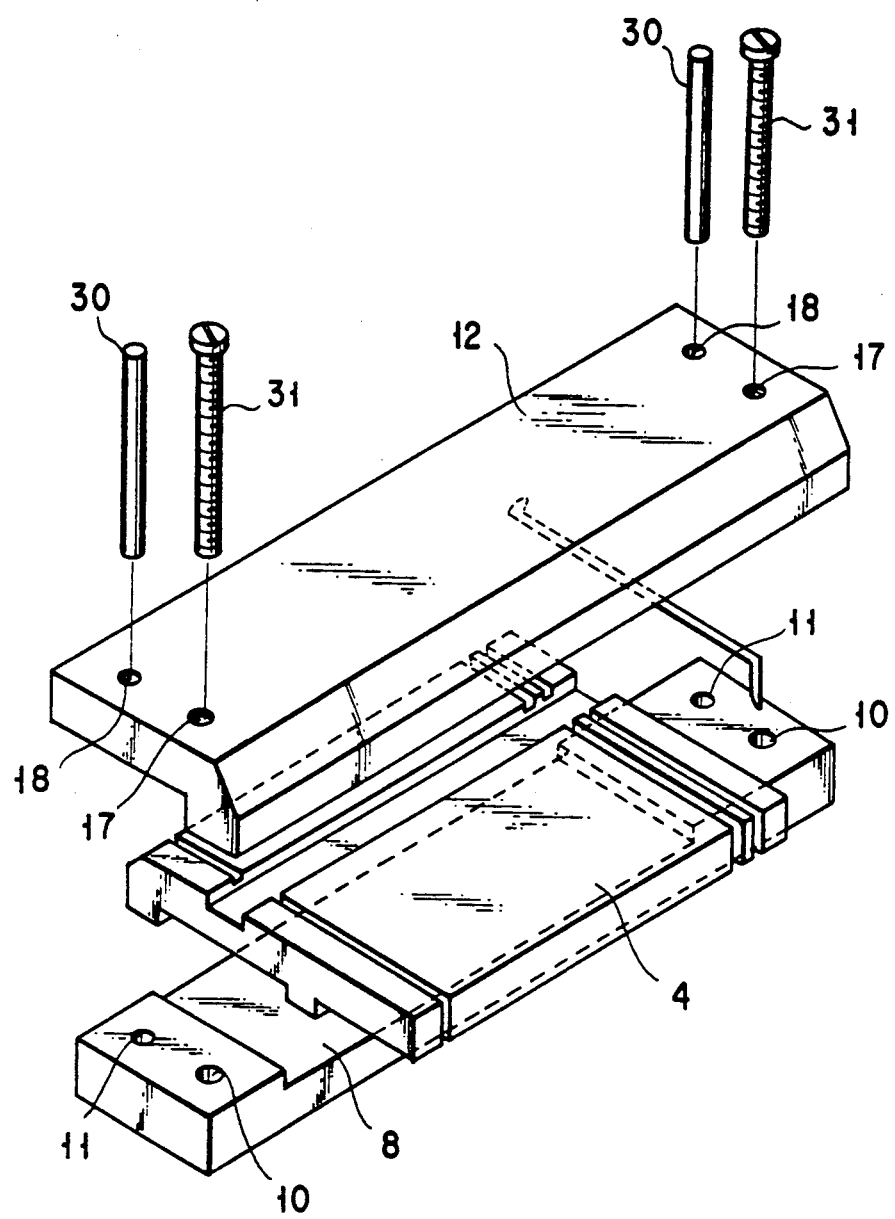
FIG. 7 is a perspective view showing the semiconductor devices testing device according to a further embodiment of the present invention.

According to the above-described embodiments, the contactor is shaped like a rectangular frame. In short, both of the positioning member 8 and the printed plate 12 are shaped like rectangular frames and four guide members 4 are held between them. They may be, however, variously-shaped frames having three or more arms to hole three or more guide members 4 (the opening of the printed plate 12 is not necessarily rectangular in this case). In addition, the contactor is not shaped like a rectangle but it may be shaped to hold one guide member 4, which contactor will be described referring to FIG. 7.

Both of the positioning member 8 and the printed plate 12 are formed like rectangular plates. Pins 30 are inserted into pin holes 11 and 18 which are formed near both ends of these plates 18 and 12. Screws 31 are then screwed into screw holes 10 and 17. The positioning member 8 and the printed plate 12 are thus combined, as unit, with each other while sandwiching the guide member 4 between them. In the case of this contactor, the semiconductor module can be probed or examined only one time through one row of leads. It is therefore preferable that the contactor is applied to those semiconductor devices to which the contactor can be applied. When every row of leads is probed or examined, however, the contactor can be applied to those semiconductor modules which have plural rows of leads.

According to the present invention, semiconductor devices having different lead patterns can be more easily probed by the same printed plate when plural contactors are used relative to this one kind of printed plate 12. When two kinds of semiconductor devices, different in dimension, are to be probed, for example, guide members 4, different in width, that is, two kinds of contactors one of which has probes different in length from those of the other may be attached to the printed plate 12. These two kinds of semiconductor devices, different in dimension, can also be probed or examined by one contactor when this contactor includes two pairs of positioning members 8 and upper guides 13 which are different in dimension in the direction crossing the opening of the printed plate 12 from the other paired positioning members 8 and upper guides 13. When a semiconductor device has one row of leads different in pitch and number from those of the other, a contactor having guide members 4 which are provided with probe holding grooves to meet the pitches and numbers of the leads can be used. Needless to say, two or more kinds of semiconductor devices can be probed or examined by a common printed plate 12 when contactors having dimensions and/or probe holding grooves to meet the leads of these semiconductor devices are used.

According to the semiconductor devices probing apparatus of the present invention, the probes 1 are seated in the guide grooves 5 on the guide member 4 and this guide member 4 is fitted onto recess 9 on the positioning member 8. The probes 1 can be therefore more accurately and more simply arranged a to certain pitch to correspond to leads 102 of the semiconductor device 101. Even when the leads 102 are arranged at a pitch smaller than 0.5 mm, for example, they can be more easily covered by arranging the grooves 5 on the guide member 4 and the pattern 16 on the printed plate 12 at such a narrow pitch.

According to the semiconductor devices probing apparatus of the present invention as described above, the probe can be more accurately and more simply arranged on the guide members so as to correspond to rows of electrode terminals of semiconductor devices to be probed or measured. In addition, the probes can be more easily exchanged with ones intended.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A testing device for electrically testing a semiconductor device having a plurality of rows of electrode terminals comprising:
   a plurality of rows of probes, each row arranged to correspond to each row of the electrode terminals, the adjacent probes having a certain pitch therebetween;
   a substrate having a conductive-pattern on one surface;
   a plurality of guide members, each of said plurality of guide members having an insulating face, and each of said plurality of guide members including a row of grooves formed in the insulating face in which one of said plurality of rows of probes are inserted;
   positioning means having a plurality of arms, each supporting and positioning one of said guide members so that the probes inserted in the grooves thereof correspond to the row of electrode terminals and the conductive pattern; and
   means for detachably fixing the substrate and the positioning means so that the conductive pattern and the probes are electrically contacted.

2. The testing device according to claim 1, wherein said positioning means includes means to support the guide members so that the guide members are limited in their movement along a plane and so that the insulating faces of said guide members are opposed to the conductive pattern of said substrate.

3. The testing device according to claim 2, further including an upper guide for sandwiching the substrate with the guide members, and said fixing means includes screws for screwing together the upper guide and the positioning means, passing through the substrate.

4. The testing device according to claim 3, wherein said positioning means includes a frame having a rectangular opening defined by said arms for supporting guide members and said upper guide has a frame shape opposed to the frame of said positioning means with the substrate interposed between them.

5. The testing device according to claim 4, wherein the frame of said positioning means has positioning pin holes and said upper guide has positioning pin holes aligned with those of the positioning means so that a positioning pin is inserted into the aligned positioning pin holes of the frame and upper guide.

6. The testing device according to claim 2, wherein each of said probes has a forward end extending in one direction and contacted with its corresponding terminal and rear projection projected in an opposite direction to contact the conductive pattern of said substrate.

7. A testing device for electrically testing a semiconductor device having at least one row of electrode terminals comprising:
   at least one row of probes arranged to correspond to the row of the electrode terminals, the adjacent probes having a certain pitch therebetween, each probe being formed of an elastic wire and including a linear base portion having first and second end portions, a first contact portion turned in one direction from the first end portion of the linear base portion, and a second contact portion projected from the second end portion of the linear base portion;
   a printed plate having a plurality of conductive lines on one surface, which are electrically contacted with the corresponding second contact portions;
   at least one guide member having an insulating face, and a row of grooves formed in the insulating face, in which the base portions of the probes are inserted;
   means for positioning and fixing the guide member and the printed plate against the semiconductor device so that first and second contact portions of the probe are respectively electrically contacted with the electrode terminal and the conductive line; and
   means provided associated with the printed plate for pressing a portion of the probe between the first and second end portions, wherein said means for pressing presses said probe in a direction onto the guide member.

8. The testing device according to claim 7, wherein each of said probes has a positioning projection projected from the linear base portion; and wherein said guide member has a recess formed in the groove and extended perpendicular to the grooves so that the positioning projection of the linear base portion of each of said probes is seated in the recess to limit its movement in its longitudinal direction.

9. The testing device according to claim 8, wherein said guide member has a groove, and said positioning means has a recess so that the guide member is fitted onto the recess on the positioning means.

10. The testing device according to claim 7 wherein said pressing means includes a through hole formed in the printed plate and extending from one face to another face, a pressing number inserted in the through hole and having one end contacted with the linear base portion of the probe, and means for forcing the pressing member toward the linear base portion.

11. The testing device according to claim 10 which further includes a frame mounted on the another face of the printed plate and having a screw through hole aligned with the positioning through hole in the printed plate; and wherein said forcing means includes a screw engaged with the screw through hole for forcing the pressing member.

12. A testing device for electrically testing a semiconductor device having at least one row of electrode terminals comprising:
   at least one row of probes arranged to correspond to the row of the electrode terminals, the adjacent probes having a certain pitch therebetween,
   a printed plate having a plurality of conductive lines on one surface;
   at least one elongate guide member having an insulating flat one face, an opposite flat face, a pair of projections projected from the opposite flat face, a pair of opposing side faces, and a row of grooves formed in the insulating flat one face in which the probes are inserted;
   a positioning member having one face and a pair of opposite end faces and a pair of projections projected from the one face, the distance between the projections of said guide member being set substantially equal to a distance between the end faces of the positioning member to allow the positioning member to be inserted between the projections of the guide member, and the distance between the projections of said positioning member being set to substantially equal to a distance between the side faces of the guide member to allow the guide member to be inserted between the projections of the positioning member, so that the guide member and positioning member are prevented from relative movement along their flat face; and
   means for detachably fixing the substrate, guide member and the positioning member so that the conductive pattern and the probes are electrically contacted.

13. The testing device according to claim 12, wherein said printed plate has a rectangular opening in the center thereof, and said positioning member supports four guide members along rims of the opening of said printed plate so that these guide members are limited in their movement in any direction on a plane and that those faces of the guide members are opposed to the conductive lines on the printed plate; and further including an upper guide for sandwiching the printed plate with the guide members, and means for fixedly screwing the upper guide and the positioning member, passing through the printed plate.

14. The testing device according to claim 12, wherein said at least one row of probes includes at least a first probe having a certain length, and at least a second probe longer than the first probe, and wherein said conductive lines includes first and second conductive lines used for different tests and the first and second probes are simultaneously and electrically contacted with the first and second conductive lines.

* * * * *